(12) United States Patent
Traeber

(10) Patent No.: US 6,813,744 B1
(45) Date of Patent: Nov. 2, 2004

(54) ACS UNIT FOR A VITERBI DECODER

(75) Inventor: Mario Traeber, Deisenhofen (DE)

(73) Assignee: Infineon Technologies AG, Munich (DE)

( * ) Notice: Subject to any disclaimer, the term of this patent is extended or adjusted under 35 U.S.C. 154(b) by 119 days.

(21) Appl. No.: 10/048,508

(22) PCT Filed: Aug. 2, 2000

(86) PCT No.: PCT/DE00/02569

§ 371 (c)(1),
(2), (4) Date: Jul. 16, 2002

(87) PCT Pub. No.: WO01/11842

PCT Pub. Date: Feb. 15, 2001

(30) Foreign Application Priority Data

Aug. 9, 1999 (DE) .......................................... 199 37 506

(51) Int. Cl.[7] ........................... H03M 13/00; H04L 5/12
(52) U.S. Cl. ...................................... 714/795; 375/262
(58) Field of Search ................................ 714/786, 795, 714/796, 792; 375/262

(56) References Cited

U.S. PATENT DOCUMENTS

| 5,781,569 A | | 7/1998 | Fossorier et al. | |
| 5,815,515 A | | 9/1998 | Dabiri | |
| 5,928,378 A | * | 7/1999 | Choi | 714/795 |
| 5,995,562 A | * | 11/1999 | Koizumi | 375/341 |
| 6,070,263 A | * | 5/2000 | Tsui et al. | 714/795 |
| 6,304,617 B1 | * | 10/2001 | Okamoto | 375/341 |

FOREIGN PATENT DOCUMENTS

| DE | 3725655 A1 | 2/1989 | |
| DE | 69115754 T2 | 8/1996 | |
| DE | 69227010 T2 | 3/1999 | |
| JP | 6-303153 | 10/1994 | .......... H03M/13/12 |
| JP | 10-107651 | 4/1998 | .......... H03M/13/12 |
| JP | 10-150370 | 6/1998 | .......... H03M/13/12 |

OTHER PUBLICATIONS

Tsui et al., "Low Power ACS Unit Design for the Viterbi Decoder," IEEE, p. I–137—I–140, (Jan. 29, 1999).

Page et al., "Improved Architectures for the Add–Compare–Select Operation in Long Constraint Length Viterbi Decoding," IEEE Journal of Solid–State Circuits, vol. 33 (No. 1), p. 151–155, (Jan. 1, 1998).

* cited by examiner

Primary Examiner—Albert Decady
Assistant Examiner—Esaw Abraham
(74) Attorney, Agent, or Firm—Jenkins, Wilson & Taylor, P.A.

(57) ABSTRACT

An ACS unit is proposed for a Viterbi decoder, which, in order to determine the path metrics of two states of a time step in a trellis diagram, compares the difference ($\Gamma$) between the path metrics of the two states (19, 20) which are linked via branches to these two states in the form of a butterfly structure, of the preceding time step in the trellis diagram, with the difference ($\Lambda$) between the corresponding branch metrics. The structure of the ACS unit is simplified in that the mathematical signals ($sg(\Gamma)$, $sg(\Lambda)$) of the two differences are also evaluated.

10 Claims, 5 Drawing Sheets

ACS UNIT FOR A VITERBI DECODER

TECHNICAL FIELD

The present invention relates to an ACS unit (Add Compare Select) as claimed in the preamble of claim 1 for a Viterbi decoder, which can be used in particular in mobile radio receivers for decoding channel-coded mobile radio signals.

BACKGROUND ART

A Viterbi decoder is used in most known digital mobile radio receivers. A Viterbi decoder is what is referred to as a maximum likelihood decoder, which is generally used for decoding channel-coded, in particular convolution-coded, mobile radio signals. During the channel coding process, redundant information is added in the transmitter to the symbols to be transmitted, in order to increase the transmission reliability. However, when a mobile radio signal is transmitted, noise is superimposed on it. The object of the receiver is thus to use the received sequence to find from all the possible transmission sequences that transmission sequence which most probably corresponds to the actual transmission sequence. This object is carried out by the Viterbi decoder.

The coding rule used for channel coding can be described by a corresponding trellis diagram. The Viterbi decoder calculates what are referred to as metrics to determine that path in the trellis diagram which has greatest or smallest path metric depending on the respective configuration of the decoder. The decoded sequence can then be determined and emitted, on the basis of this path in the trellis diagram.

The principles of Viterbi decoding will be explained in more detail, briefly, in the following text.

By way of example, FIG. 4 shows a trellis diagram in each case having four different states at the times t . . . t+3, which correspond, for example, to the bit states '00', '10', '01' and '11'. Each symbol sequence is allocated a corresponding path in the trellis diagram. A path in this case comprises a sequence of branches between two successive states in time. Each branch in this case symbolizes a state transition between two successive states in time, with, for example, the upper branch originating from one state corresponding to a received symbol with the binary value '0', and the lower branch originating from the same state corresponding to a received symbol with the binary value '1'. Each of these state transitions, to which a branch metric (BM) $\lambda_t$ is assigned, corresponds to a transmitted symbol. The branch metric $\lambda_t$ is defined as follows:

$$\lambda_1 = |y'_1 - r_1^2|$$

In this case, $r_t$ corresponds to the received symbol at the time t, and $y'_t$ corresponds to the expected transmitted symbol, as a function of this, at the time t.

Furthermore, each path through the trellis diagram is assigned a path metric $\gamma_t$ until the time or time step t.

The trellis diagram illustrated in FIG. 4 is, in particular, a trellis diagram with what is referred to as a butterfly structure. This means that two states of a time step t+1 in the trellis diagram are in each case assigned two states from the previous time step t, whose branches each lead to the first-mentioned states in the time step t+1, with two branch metrics of the branches originating from different states in each case being identical. Thus, for example, the states shown in FIG. 4, to which the path metrics $\gamma_t^{(1)}, \gamma_t^{(3)}, \gamma_{t-1}^{(2)}$ and $\gamma_{t+1}^{(3)}$ are assigned, form such a butterfly structure, with the branch metric for the branch from the state with the path metric $\gamma_t^{(1)}$ to the state with the path metric $\gamma_{t+1}^{(2)}$ corresponding to the branch metric $\lambda_t^{(3)}$ of the branch from the state with the path metric $\gamma_t^{(3)}$ to the state with the path metric $\gamma_{t-1}^{(3)}$ while, on the other hand, the branch metric of the branch from the state with the path metric $\gamma_t^{(1)}$ to the state with the path metric $\gamma_{t+1}^{(3)}$ corresponds to the branch metric $\lambda_t^{(1)}$ of the branch from the state with the path metric $\gamma_t^{(3)}$ to the state with the path metric $\gamma_{t+1}^{(2)}$. In this case, in general form, $\gamma_t^{(s)}$ denote the path metric assigned to the state s in the time step t, while $\gamma_t^{(s)}$ denotes the branch metric of the state transition, corresponding to the signal s, at the time t.

The Viterbi decoder now has to use the trellis diagram to determine that path which has the best path metric. In general, by definition, this is the path with the smallest path metric.

Each path metric of a path leading to a specific state is composed of the path metric of a previous state in time and of the branch metric of the branch leading from this previous state to the specific state. This means that there is no need to determine and evaluate all the possible paths and path metrics in the trellis diagram. Instead of this, that path which has the best path metric up to this time is determined for each state and for each time step in the trellis diagram only this path, which is referred to as the survivor path, and its path metric need be stored. All the other paths which lead to this state can be ignored. Accordingly, during each time step, there are a number of such survivor paths corresponding to the number of different states.

The above description makes it clear that the calculation of the path metric $\gamma_{t+1}^{(s)}$ depends on the path metrics of the path metrics of the previous time step t connected to the state s via one branch. The path metrics can accordingly be calculated by means of a recursive algorithm, which is carried out by what is referred to as an Add Compare Select unit (ACS unit) in a Viterbi decoder.

FIG. 5 shows the typical configuration of a Viterbi decoder. In addition to the ACS unit, the Viterbi decoder has a branch metric unit (BMU) and a survivor memory unit. The object of the branch metric unit is to calculate the branch metrics $\gamma_t^{(s)}$, which are a measure of the difference between a received symbol and that symbol which causes the corresponding state transition in the trellis diagram. The branch metrics calculated by the branch metric unit are supplied to the ACS unit in order to determine the optimum paths (survivor paths), with the survivor memory unit storing these survivor paths so that, in the end, decoding can be carried out on the basis of that survivor path which has the best path metric. The symbol sequence associated with this path has the highest probability of corresponding with the actually transmitted sequence.

A processor element 1 in a conventional ACS unit can be designed as shown by way of example in FIG. 6. In this case, it is assumed that each state in the trellis diagram is evaluated by a separate processor element 1. The task of the processor element 1 is to select from two mutually competing paths which lead to one state in the trellis diagram that path which has the best, that is to say lowest, path metric. The stored values for the survivor path leading to this state, and its path metric, are then updated.

As can be seen from the trellis diagram shown in FIG. 4, each state s at the time t+1 is connected via an upper branch and a lower branch to a corresponding previous state. In order to determine the survivor path corresponding to this state s, the path metric of the path leading via the upper branch to the state s must therefore be compared with the path metric of the path leading via the lower branch to the state s, that is to say the task of the processor element 1 shown in FIG. 6, in order to determine the survivor path with the path metric $\gamma_{t+1}^{(s)}$ is to select either the path which leads via the previous 'upper' state with the path metric $\gamma_t^{(0)}$ and the 'upper' branch with the path metric $\lambda_t^{(0)}$ and whose path metric corresponds to the sum $\gamma_t^{(0)}+\lambda_t^{(0)}$ or the path which leads via the lower state with the path metric $\gamma_t^{(1)}$ and the lower branch with the branch metric $\lambda_t^{(1)}$ and whose path metric corresponds to the sum $\gamma_t^{(1)}+\lambda_t^{(1)}$.

The operation of the processor element described above can in consequence be carried out, for example, by the circuit shown in FIG. 6, in which the possible path metrics are calculated by means of adders 14 and 15 and are compared by means of a comparator 16, so that, depending on the comparison result $\delta_s$, the smaller of the sums calculated by the two adders 14 or 15 can then be emitted, with the aid of the multiplexer 17, as the path metric $\gamma_{t-1(s)}$.

FIG. 7 shows the overall configuration and the connection of an ACS unit to the branch metric unit and to the survivor memory unit, for the trellis diagram shown by way of example in FIG. 4. Since each result $\gamma_t^{(s)}$ which is calculated for a state s in the time step t at the same time forms the basis for the calculation of a path metric for a successive state in time, the feedback of the processor element 1, as shown in FIG. 7, via an intermediate register 18 is required. The decision or signal values $\delta_0 \ldots \delta_3$ supplied from the individual processor elements 1 to the survivor path unit allow the selection and storage of the correct survivor paths, and of their path metrics.

The already described ACS unit is the most computationally intensive part of a Viterbi decoder. This occupies the greatest surface area and has the highest power requirement. For applications in mobile radio technology, the complexity of the ACS unit in this case rises exponentially with the complexity of the respective code used for channel coding of mobile radio signals.

There is thus a fundamental requirement to keep the circuit complexity for the ACS unit as simple as possible. It has therefore been proposed, for example in the document "Low Power ACS Unit Design For The Viterbi Decoder", Chi-ying Tsui, Roger S. K. Cheng, Curtis Ling, Conference IEEE ISCAS, 1999, Orlando, which describes an ACS unit as claimed in the preamble of claim 1, for determining a survivor path of a state, to form the difference between the path metrics for those previous states from each of which one branch leads to the state under consideration, and to compare this with the difference between the corresponding branch metrics. Depending on the comparison result, it is thus possible to directly deduce the survivor path, and hence the sum that needs to be formed to calculate the corresponding path metric. This procedure has the advantage that, assuming the already mentioned butterfly structure, the differences can be worked out jointly for the calculation of the path metrics from two states in one time step in the trellis diagram, which means that the circuit complexity can be reduced.

However, this procedure still also requires the separate formation of a comparison for determining the path metrics of the upper and lower states of a time step associated with the respective butterfly structure, with two comparators correspondingly being required for this purpose.

U.S. Pat. No. 5,781,569 discloses an ASC unit which comprises an adder for supplying the magnitude and the mathematical sign of a difference of state weights and path metrics at a time t, a further adder for supplying the magnitude and the mathematical sign of a difference of branch metrics, a comparator which compares the magnitudes of the differences and supplies a signal which indicates which difference is the greater, and a control logic device, which uses the mathematical signs and the signal from the comparator to determine which state weights and metrics are used in order to determine the weights of states at a time t+1 using still further adders.

The article by Page et al. "Improved Architectures for the Add-Compare-Select Operation in Long Constraint Length Viterbi Decoding", IEEE 1998 (XP66629) discloses a decoupled architecture for ACS units, which is optimized such that the buffer storage requirements in the form of registers for ACS units and with a large number of output state metrics and path metrics are reduced.

U.S. Pat. No. 5,815,515 discloses two specialized butterfly calculation units, which are each used as a function of edge metric values for edges which connect the states in a Viterbi decoder to calculate path weights for a time t+1 from path weights for a preceding time t.

SUMMARY OF THE INVENTION

Against the background of this prior art, the present invention is therefore based on the object of providing an ACS unit for a Viterbi decoder with less complex circuitry and occupying less surface area.

According to the invention, this object is achieved by an ACS unit having the features of claim 1. The dependent claims define advantageous and preferred embodiments of the present invention.

According to the invention, assuming the already described butterfly structure of the trellis diagram, the path metrics from two states of a time step in the trellis diagram are calculated as a function of a comparison between the difference of the path metrics of those states which are connected to these states via the butterfly structure in the immediately preceding time slot in the trellis diagram, and the difference between the corresponding branch metrics, with the mathematical signs of the path metric difference and of the branch metric difference also being calculated.

This procedure results in a considerable reduction in the circuitry complexity of the ACS unit. Investigations have shown that the computation complexity can be reduced by about 33% by means of the present invention for all codes currently used in digital communications technology (mobile radio technology (for example in accordance with the GSM or UMTS mobile radio standard), satellite communication, and wire-free communication in general). A corresponding power saving is thus also possible, in comparison to the known prior art. In particular, in comparison to the ACS unit proposed in the document "Low Power ACS Unit Design For the Viterbi Decoder", Chi-ying Tsui, Roger S. K. Cheng, Curtis Ling, Conference IEEE ISCAS, 1999, Orlando, there is no need for a separate comparator for determining the path metrics of the upper and lower state of the butterfly structure. The comparison to be formed in the ACS unit according to the invention between the path metric difference described above and the branch metric difference can be carried out with a small number of bits, which likewise contributes to a saving in the circuit surface area and power required.

The ACS unit according to the invention can be produced using simple means, both in the form of a combinational circuit as well as in the form of a sequential circuit. The surface area required for the ACS unit is reduced in particular since two trellis states can be processed simultaneously by means of the present invention. All the states in one time step of the respectively used trellis diagram can be processed either completely in parallel (if the number of processor elements in the ACS unit corresponds at least to half the number of states in a time step) or by time-division multiplexing (if the number of processor elements is less).

According to one preferred embodiment of the present invention, an input comparator can also be provided, which compares specific bits in the path metric difference and branch metric difference with one another, with the comparison result also being evaluated in order to make it possible where possible even at an early stage, to determine the components that need to be added to calculate the path metrics, without needing to activate the actual comparator for this purpose. If a two's complement representation is used, it is thus possible, for example, to determine the ratio of the mathematical signs in the path metric difference and the branch metric difference by comparing the most significant bits.

BRIEF DESCRIPTION OF THE INVENTION

The present invention will be explained in more detail in the following text using a preferred exemplary embodiment and with reference to the attached drawing.

In order to explain the invention, the following text will once again contain a brief description of the already explained butterfly structure, which represents a precondition for the present invention.

DETAILED DESCRIPTION OF THE INVENTION

Figure 2:
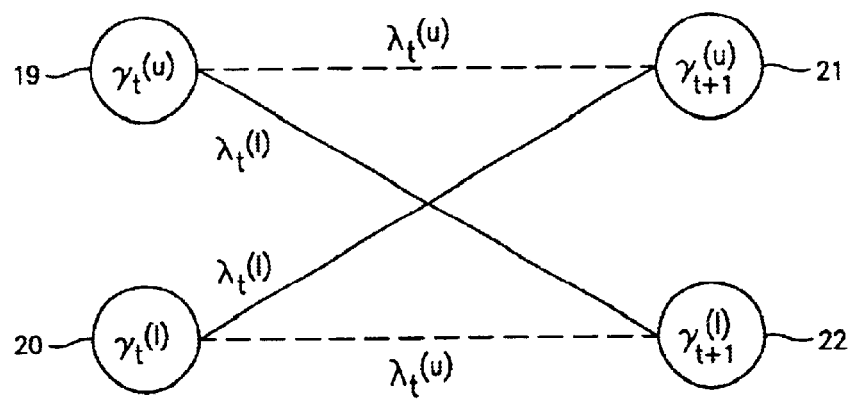
FIG. 2 shows an illustration to explain the butterfly structure of a trellis diagram.
Figure 4:
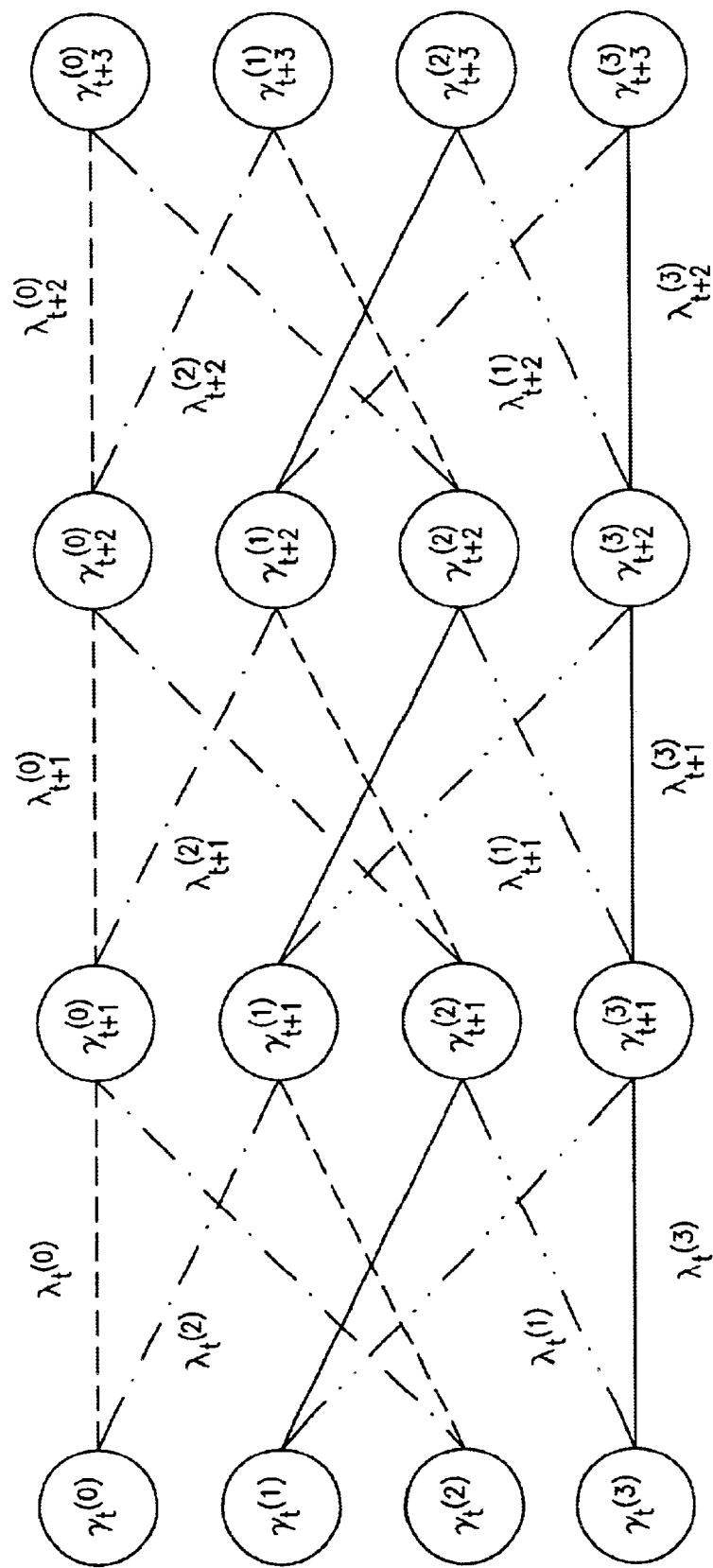
FIG. 4 shows an example of a trellis diagram with four states.
Figure 5:
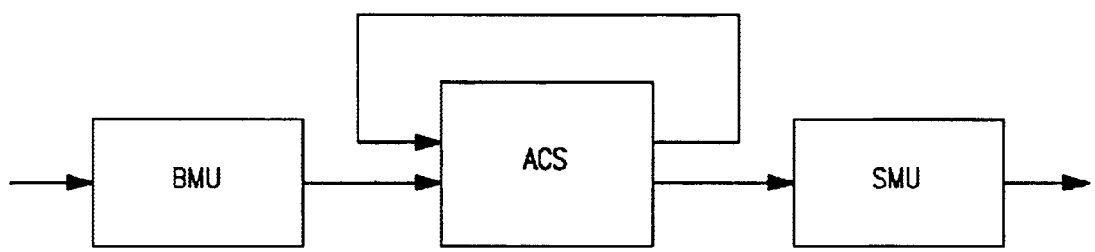
FIG. 5 shows the general configuration of a Viterbi decoder.

As can also be seen from the trellis diagram shown by way of example in FIG. 4, the trellis diagram has a certain regularity in its structure. This structure is composed of what are referred to as butterflies, with one such butterfly being shown in FIG. 2. According to the butterfly structure, two states 19 and 20 in one time step t are connected to two states 21 and 22 in the next time step t+1 such that in each case a branch leads to the state 21 and a branch leads to the state 22 from each of these states 19 and 20, with the branch metric $\lambda_t^{(0)}$ of the branch leading from the state 19 to the state 21 corresponding to the branch metric of the branch leading from the state 20 to the state 22, and the branch metric $\lambda_t^{(1)}$ of the branch leading from the state 19 to the state 22 corresponding to the branch metric of the branch leading from the state 20 to the state 21. FIG. 2 also shows the path metrics $\gamma_t^{(0)}, \gamma_t^{(1)}, \gamma_{t+1}^{(0)}$ and $\gamma_{t+1}^{(1)}$ corresponding to the individual states.

This regularity of the butterfly structure is utilized for the purposes of the present invention in order to reduce the number of arithmetic operations required to determine the upper path metric $\gamma_{t+1}^{(0)}$ and the lower path metric $\gamma_{t+1}^{(1)}$.

The best path metric of the theoretically possible path metrics must in each case be determined in order to establish the path metrics $\gamma_{t+1}^{(0)}$ and $\gamma_{t+1}^{(1)}$. Each path metric for one state is composed of the path metric for a state in the previous time step, and the branch metric of the connecting branch between these two states. Thus, in order to establish the path metric $\gamma_{t+1}^{(1)}$, the smaller of the theoretically possible path metrics $\gamma_t^{(0)}+\lambda_t^{(0)}$ and $\gamma_t^{(1)}+\lambda_t^{(1)}$ must be determined, and the smaller of the theoretically possible path metrics $\gamma_t^{(0)}+\lambda_t^{(1)}$ and $\gamma_t^{(1)}+\lambda_t^{(0)}$ must be determined in order to establish the path metric $\gamma_{t+1}^{(1)}$. The following comparison operations are thus required:

$\gamma_t^{(0)}+\lambda_t^{(0)} \triangleright\triangleleft \gamma_t^{(1)}+\lambda_t^{(1)}$ for the upper state $\gamma_t^{(0)}+\lambda_t^{(1)} \triangleright\triangleleft \gamma_t^{(1)}+\lambda_t^{(1)}$ for the lower state Each comparison operation is in this case represented by the operator $\triangleright\triangleleft$.

The comparison operations to be carried out for the upper state 21 and for the lower state 22 in the butterfly structure have a certain similarity.

The branch metrics and path metrics can be separated from one another by subtraction, so that a comparison between a path metric difference and a branch metric difference for the upper and lower states, respectively, results in:

$\lambda_t^{(0)}-\lambda_t^{(1)} \triangleright\triangleleft \gamma_t^{(1)}-\gamma_t^{(0)}$ for the upper state $\lambda_t^{(1)}-\lambda_t^{(0)} \triangleright\triangleleft \gamma_t^{(1)}-\gamma_t^{(0)}$ for the lower state If a path metric difference $\Gamma_t=\gamma_t^{(1)}-\gamma_t^{(0)}$ and a branch metric difference $\Lambda_t=\lambda_t^{(1)}-\lambda_t^{(0)}$ are defined for these differences, then this results, for the comparison operations to be carried out, in:

$\Lambda_t \triangleright\triangleleft \Gamma_t$ for the upper state $-\Lambda_t \triangleright\triangleleft \Gamma_t$ for the lower state The two comparisons can be solved by the absolute or magnitude comparison $|\Lambda_t| \triangleright\triangleleft |\Gamma_t|$. The result of this comparison defines the relationship between $|\Lambda_t|$ and $|\Gamma_t|$. Since the metrics $\lambda_t^{(0)}, \lambda_t^{(1)}, \gamma_t^{(1)}$ and $\gamma_t^{(0)}$ are, by definition, positive, none of the inequalities mentioned above was changed by the mathematical modifications previously carried out. The inequalities originally produced in order to determine the path metrics $\gamma_{t-1}^{(0)}$ and $\gamma_{t-1}^{(1)}$ for the upper state 21 and for the lower state 22 can thus be solved by evaluating the mathematical signs of $\Lambda_t$ and $\Gamma_t$, in which case it is necessary to ensure that $|\Lambda_t|$ is provided with a negative mathematical sign for the inequality of the lower state 22.

The result of these analyses is that only a single absolute comparison need be carried out to establish the path metrics $\gamma_{t-1}^{(0)}$ and $\gamma_{t+1}^{(1)}$, in which case the final decision is then made as a function of this comparison result by evaluating the mathematical signs of $\Lambda_t$ and $\Gamma_t$. As will be explained in more detail in the following text, this can be done using relatively simple circuitry means.

Figure 1:
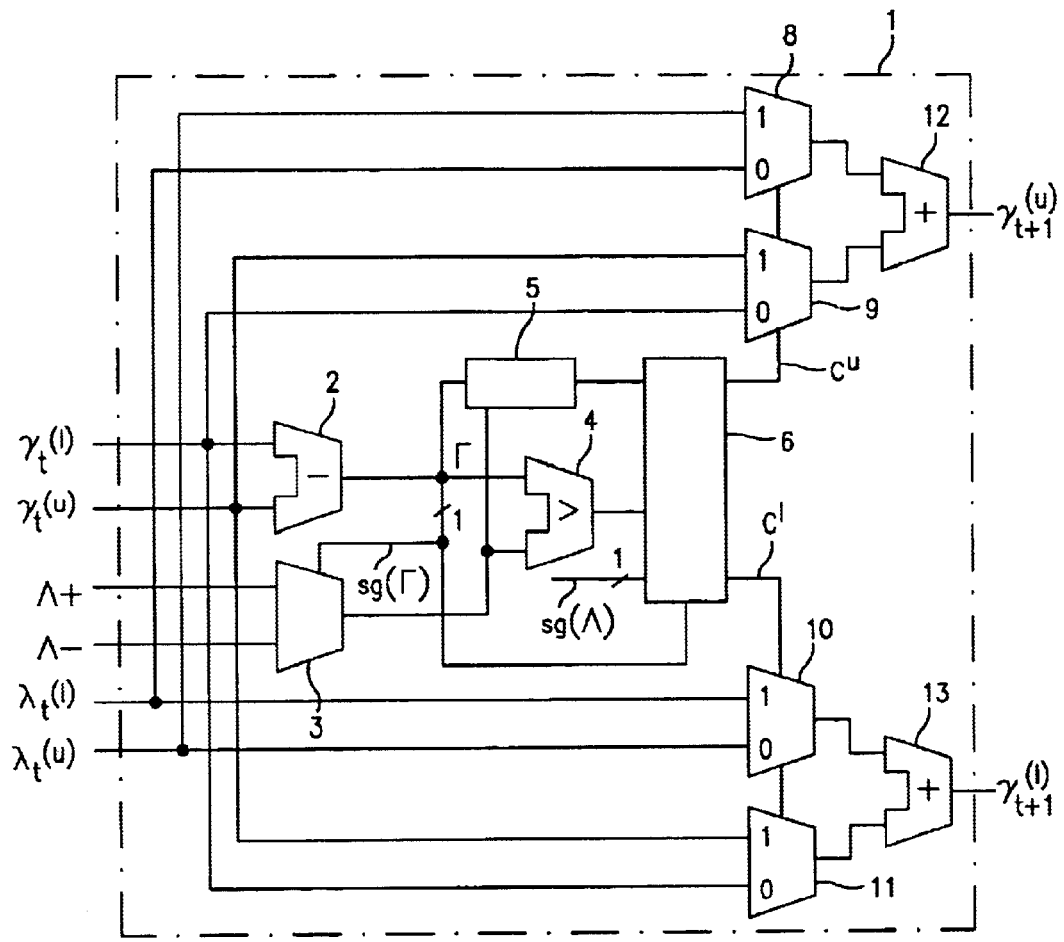
FIG. 1 shows a block diagram of a processor element in an ACS unit according to the present invention.

FIG. 1 shows a block diagram of an exemplary embodiment for a processor element 1 of the ACS unit in a Viterbi decoder. The processor element 1 is used to calculate the path metrics $\gamma_{t+1}^{(0)}$ and $\gamma_{t+1}^{(1)}$ for two states in a time step t+1, in a trellis diagram and receives, as input signals, the path metrics $\gamma_{t(1)}$ and $\gamma_t^{(0)}$ of those two states in the previous time step t in the trellis diagram which, together with the two states to be calculated, form the butterfly structure shown in FIG. 2. Futhermore, the processor element 1 receives, as input signals, the branch metrics $\lambda_t^{(0)}$ and $\lambda_t^{(1)}$ of the corresponding connecting branches in this butterfly structure. The path metrics $\gamma_t^{(1)}, \gamma_t^{(0)}$ and the branch metrics $\lambda_t^{(0)}$, $\lambda_t^{(1)}$ are respectively supplied to multiplexers 8 and 9, and 10 and 11, respectively, which, depending on a control signal $C^0$ or $C^1$ supply one of their two input values to a respective adder 12 or 13, which finally emits the smaller of the respective two possible sums as the path metric $\gamma_{t+1}^{(0)}$ or $\gamma_{t+1}^{(1)}$. The decision or control signals $C^0$ or $C^1$ are also supplied (invented) to the survivor memory unit.

The control signals $C^0$ and $C^1$ are produced by an evaluation unit 6. A subtractor 2 and a comparator 4 are provided in order to drive the evaluation unit 6, with the subtractor 2 calculating the difference between the two path metrics $\gamma_t^{(1)}$ and $\gamma_t^{(0)}$, while the comparator 4 compares the path metric difference $\Gamma$ resulting from this with an externally supplied branch metric difference $\Lambda$, and supplies the comparison result to the evaluation unit 6.

The branch metric difference $\Lambda=\lambda_t^{(0)}-\lambda_t^{(1)}$ is calculated in the branch metric unit (BMU) and is supplied to the ACS unit and to the processor element 1 in two different versions, namely firstly as the normal branch metric difference $\Lambda+$ and secondly as the negated branch metric difference $\Lambda-$. The choice as to which of the two branch metric versions should be used for the comparison with the path metric difference $\Gamma$ is made by a multiplexer 3, which is driven as a function of the mathematical sign bit sg($\Gamma$) of the path metric difference. If a two's complement representation is used, the mathematical sign bit corresponds to the MSB (Most Significant Bit). As will be explained in more detail in the following text, it is necessary to distinguish between the two branch metric versions so that it is always possible to compare values having the same mathematical signs with one another, and thus to calculate a correct comparison result.

As has already been mentioned, the comparator 4 determines the result of the absolute comparison $C=|\Gamma_t|>|\Lambda_t|$. Since both $\Gamma_t$ and $\Lambda_t$ may be positive or negative, there are four possible value combinations which could make it necessary to invert the determined comparison value C in order actually to make it possible to correctly model the previously described inequalities for the upper and lower states, and to select the correct values for the path metric calculation via the respective multiplexer 8, 9 or 10, 11.

Figure 3:
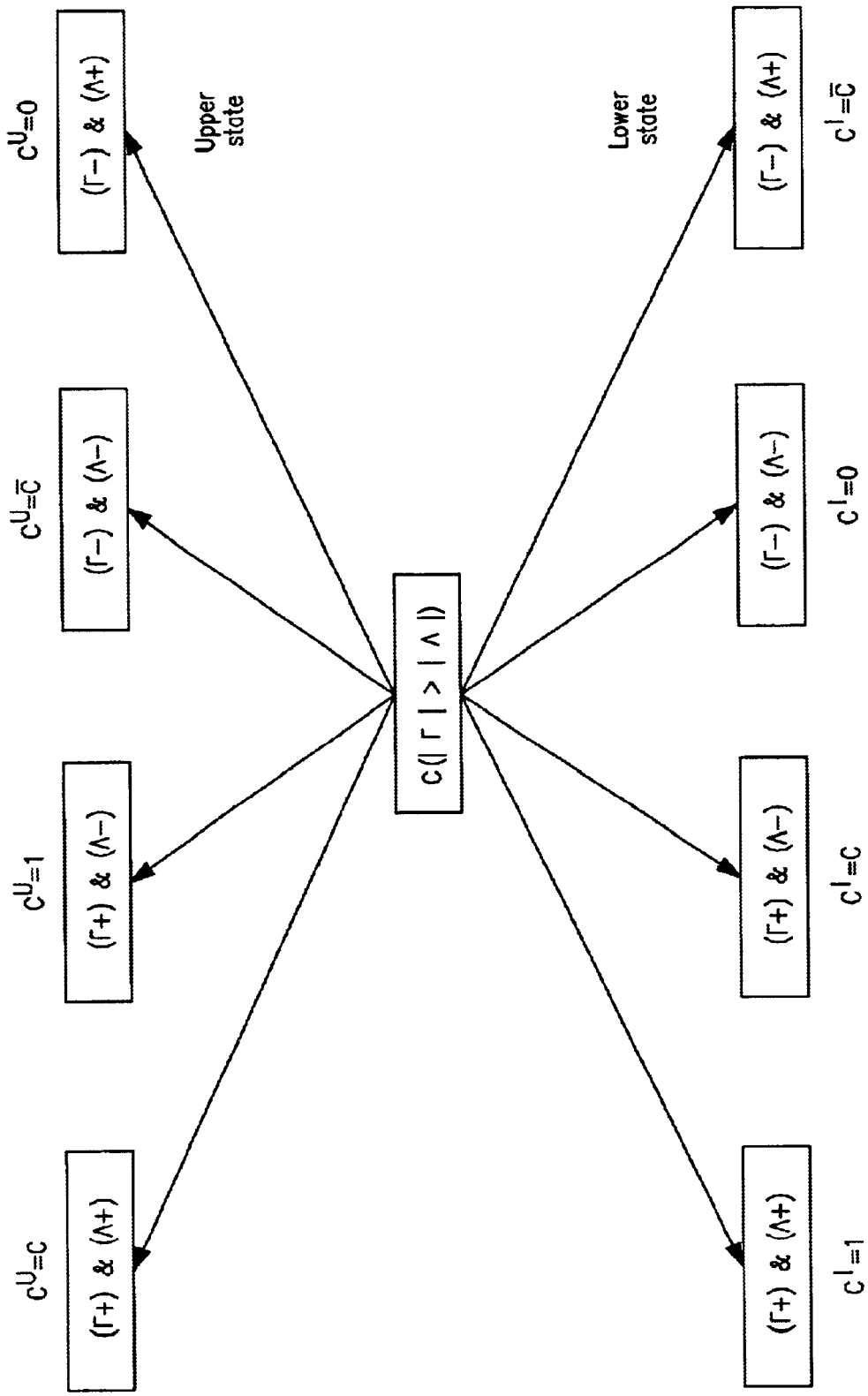
FIG. 3 shows an illustration to explain the principle which is fundamental to the present invention, of calculating path metrics.

The corresponding logic is shown in FIG. 3, with the possible combinations of the mathematical signs of $\Gamma$ and $\Lambda$ and the respective values for $C^0$ and $C^1$ that follow from them in each case being respectively represented for the upper state and the lower state as a function of the absolute comparison result C. A suffix minus sign in this case corresponds to a negative mathematical sign, while a suffix plus sign corresponds to a positive mathematical sign so that, for example, $\Gamma-$ represents a negative path difference value, and $\Gamma+$ represents a positive path difference value.

FIG. 3 shows, in particular that the values for $C^0$ and $C^1$ can be determined just by evaluation of the mathematical signs of $\Gamma$ and $\Lambda$ for two possible mathematical sign combinations for both the upper state and the lower state, without actually having to carry out the absolute comparison and thus having to calculate the value C. The "comparison result", that is to say the control signals $C^0$ and $C^1$, are thus available considerably earlier in these cases, since no comparison need be carried out, resulting in a considerable reduction in the glitch probability in the selection multiplexers 8, 9 and 10, 11.

In all other cases of the mathematical signs of $\Gamma$ and $\Lambda$, the values for $C^0$ and $C^1$ are calculated analogously to the logic shown in FIG. 3, as a function of the value C of the absolute comparison result.

The determination of the values for $C^0$ and $C^1$ as a function of the mathematical signs sg($\Gamma$) and sg($\Lambda$) and the value of the absolute comparison $C=|\Gamma_t|>|\Lambda_t|$ is carried out, as shown in FIG. 1, in the evaluation unit 6. As has already been described with reference to FIG. 3, the evaluation unit need only evaluate the mathematical signs sg($\Gamma$) and sg($\Lambda$) to this end and, depending on the result, assign to the values $C^0$ and $C^1$ either the fixed binary value '1', the fixed binary value '0' the unchanged value C of the comparison result or the negated value $\overline{C}$ of the comparison result. The multiplexer 3 in this case ensures that the correct values $\pm\Gamma_t>\pm\Lambda_t$ are always compared with one another in order to carry out the absolute comparison $|\Gamma_t|>|\Lambda_t|$.

Figure 6:
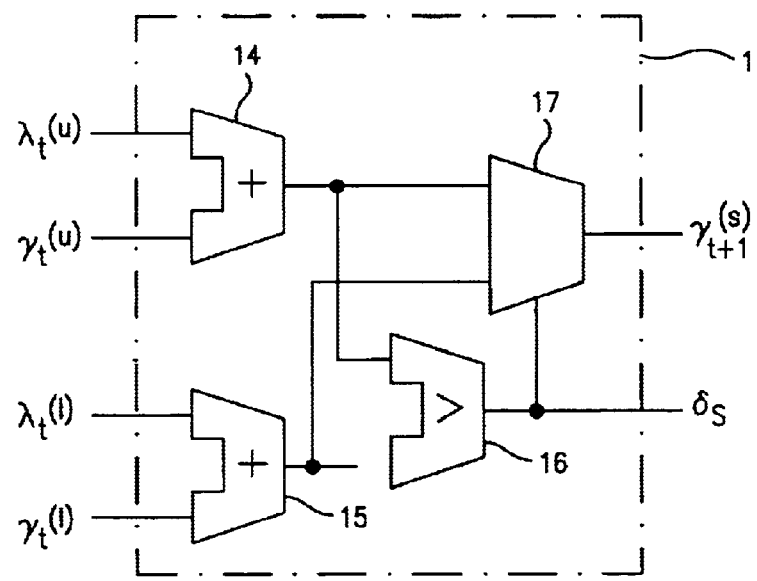
FIG. 6 shows a block diagram of a processor element in a known ACS unit.

The use of the logic shown in FIG. 3 means that only one absolute comparison $C=|\Gamma_t|>|\Lambda_t|$ may be evaluated in order to make it possible, as a function of this, to calculate both the upper path metric $\gamma_{t+1}^{(0)}$ and the lower path metric $\gamma_{t+1}^{(1)}$. If it is assumed that the complexity of a comparator corresponds essentially to that of an adder or subtractor, it can easily be seen by comparison of the processor elements 1 shown in FIG. 1 and FIG. 6 that the present invention makes it possible to save approximately 33% of the processor topology shown in FIG. 6 (four adder, subtractor or comparator units in FIG. 1 in comparison to six adder or comparator units in FIG. 6). Furthermore, it should be noted that the path metrics $\gamma_{t+1}^{(0)}$ and $\gamma_{t+1}^{(1)}$ are calculated for both states of one butterfly in the time step t+1 at the same time by means of the processor element 1 according to the invention, while the processor element shown in FIG. 1 is intended to calculate the path metric for only one state.

As an advantageous development, an input comparator 5 is provided in the processor element 1 shown in FIG. 1, and is designed such that it carries out an initial comparison of the path metric difference $\Gamma$ with the branch metric difference $\Lambda$. In general, the input comparator 5 can be designed such that it compares the most significant bits of the path metric difference and of the branch metric difference with one another in order thus, possibly to detect different numbers of bits. The input comparator 5 can thus, for example, be designed such that it compares only the most significant bit (MSB) of the path metric difference and of the branch metric difference since, for two's complement representation, the situations $\Gamma+\&\Lambda-$ and $\Gamma-\&\Lambda+$ (see FIG. 3), for example, can in this way even be detected in advance. The comparison result is supplied as a further input signal to the evaluation unit 6.

Figure 7:
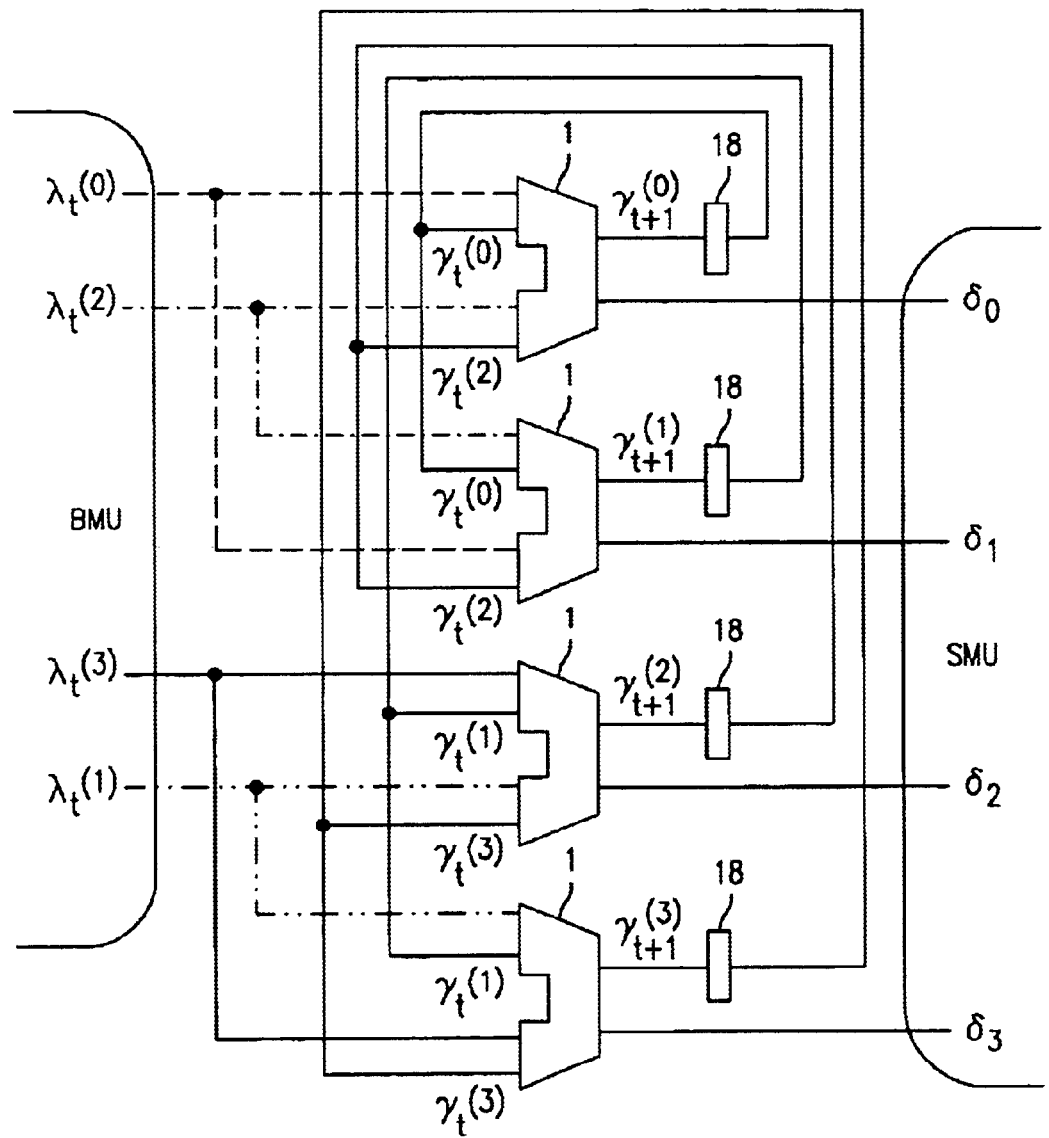
FIG. 7 shows the configuration of a known ACS unit with a number of the processor elements shown in FIG. 6, and this ACS unit connected in a Viterbi decoder.

Also according to the invention, and as a function of the number of different states in the respectively used trellis diagram, the ACS unit has a number of the processor elements 1 as shown in FIG. 1, whose outputs are fed back, analogously to FIG. 7, via registers 18 for buffer-storage units of the determined path metric values. Owing to this feedback, the path metric values are gradually incremented, so that, as shown in FIG. 1, preferably one renormalization unit (not shown) can be interposed, as shown in FIG. 1, in the input-side circuit paths which are associated with the path metrics $\gamma_t^{(0)}$ and $\gamma_t^{(1)}$ and lead to the comparator 2 and to the multiplexers 9 and 11, and this avoids any overflow while renormalizing the fed-back path metric values.

The respectively best, that is to say minimum, path metric determined in the manner described above is buffer-stored together with the corresponding path in the survivor memory unit for each state of a time step in the trellis diagram. The major difference between the use of the processor elements 1 (as shown in FIG. 1) in an ACS unit and the illustration in FIG. 7 is just that the processor elements 1 according to the invention and shown in FIG. 1 are intended to calculate two path metrics $\gamma_{t+1}^{(0)}$ and $\gamma_{t+1}^{(1)}$.

What is claimed is:

1. An ACS unit for a Viterbi decoder, with the ACS unit being intended for determining path metrics of a trellis diagram assigned to the Viterbi decoder, with a first and a second state of a time step (t+1) in the trellis diagram in each case being assigned to a third and a fourth state, which are each linked thereto via a path in the trellis diagram, from the preceding time step (t), with a first branch metric $(\lambda_t^{(0)})$ in the trellis diagram for the branch which connects the first state to the fourth state and for the branch which connects the second state to the third state being of equal magnitude, and a second branch metric $(\lambda_t^{(1)})$ being of the same magnitude for the branch which connects the first state to the third state and for the path which connects the second state to the fourth state, and with the ACS unit having a processor element for determining the path metrics $(\gamma_{t+1}^{(0)}, \gamma_{t-1}^{(1)})$ associated with the first and second states, which processor element receives, as input values, the first and second branch metric $(\lambda_t^{(0)}, \lambda_t^{(1)})$ as well as the path metrics $(\gamma_t^{(0)}, \gamma_t^{(0)})$ associated with the third and fourth states, respectively, and comprising:

a differentiation device for calculating a path metric difference ($\Gamma$) between the path metrics $(\gamma_t^{(0)}, \gamma_t^{(1)})$ associated with the third and fourth states, and an evaluation device for comparing the path metric difference ($\Gamma$) with a branch metric difference ($\Lambda$) between the first and second branch metrics $(\lambda_t^{(0)}, \lambda_t^{(1)})$ and for determining the path metric $(\gamma_{t+1}^{(0)}, \gamma_{t+1}^{(1)})$ associated with the first and second states, as a function of the comparison result, in which the evaluation device designed such that it determines the path metrics $(\gamma_{t+1}^{(0)}, \gamma_{t+1}^{(1)})$ associated with the first and second states as a function of the comparison result, while additionally evaluating the mathematical signs of the path metrics difference ($\Gamma$) and of the branch metrics difference ($\Lambda$), wherein the evaluation device is designed such that it produces a first control signal for a first selection device associated with the first state and a second control signal for a second selection device associated with the second state, as a function of the comparison result and the mathematical signs of the branch metrics difference ($\Gamma$) and the path metrics difference ($\Lambda$), and wherein the first selection device is designed such that it emits either the sum of the path metric $(\gamma_{(t)}^{(0)})$ of the fourth state and the first branch metric $(\gamma_t^{(0)})$, or the sum of the path metric $(\gamma_t^{(1)})$ of the third state and the second branch metric $(\lambda_t^{(1)}$ as a function of the first control signal as the path metric $(\gamma_{t+1}^{(0)})$ of the first state, and wherein the second selection device is designed such that it emits either the sum of the path metric $(\gamma_t^{(0)})$ of the fourth state and the second branch metric $(\lambda_t^{(1)})$ or the sum of the path metric $(\gamma_t^{(1)})$ of the third state and the first branch metric $(\lambda_t^{(0)})$ as a function of the second control signal as the path metric $(\gamma_{t+1}^{(1)})$ of the second state.

2. The ACS unit as claimed in claim 1, wherein the first and the second selection device respectively have a first and a second multiplexer which are driven respectively by the first and second control signal with the first multiplexer receiving as input signals the first and the second branch metric $(\lambda_t^{(0)}, \lambda_t^{(1)})$ and the second multiplexer receiving as input signals the path metrics $(\gamma_t^{(0)}, \gamma_t^{(1)})$ associated with the third and fourth states, and with the output signals from the first and second multiplexers being supplied to an adder.

3. The ACS unit as claimed in claim 1, wherein the evaluation device is designed such that it assigns a fixed binary value to the first control signal without needing to form the comparison between the path metric difference ($\Gamma$) and the branch metric difference ($\Lambda$) if the path metric difference ($\Gamma$) and the branch metric difference ($\Lambda$) have different mathematical signs, and wherein the evaluation device is designed such that it assigns a fixed binary value to the second control signal without needing to form the comparison between the path metric difference ($\Gamma$) and the branch metric difference ($\Lambda$), if the path metric difference ($\Gamma$) and the branch metric difference ($\Lambda$) have identical mathematical signs.

4. The ACS unit as claimed in claim 3, wherein the evaluation device assigns a first binary value to the first control signal, by means of which first binary value the sum of the path metric $(\gamma_t^{(0)})$ of the fourth state and the first branch metric $(\lambda_t^{(0)})$ is emitted from the first selection device as the path metric $(\gamma_{t+1}^{(0)})$ of the first state, if the path metric difference ($\Gamma$) has a positive mathematical sign and the branch metric difference ($\Lambda$) has a negative mathematical sign, and wherein the evaluation device assigns a second binary value, which corresponds to the inverted first binary value, to the first control signal, by means of which second binary value the sum of the path metric $(\gamma_t^{(1)})$ of the third state and of the second branch metric $(\lambda_t^{(1)})$ is emitted from the first selection device as the path metric $(\gamma_{t+1}^{(0)})$, if the path metric difference ($\Gamma$) has a negative mathematical sign, and the branch metric difference ($\Lambda$) has a positive mathematical sign.

5. The ACS unit as claimed in claim 3, wherein the evaluation device assigns a first binary value to the second control signal, by means of which first binary value the sum of the path metric $(\gamma_t^{(0)})$ of the fourth state and the second branch metric $(\lambda_t^{(1)})$ is emitted from the second selection device as the path metric $(\gamma_{t-1}^{(1)})$, if the path metric difference ($\Gamma$) and the branch metric difference ($\Lambda$) each have a positive mathematical sign, and wherein the evaluation device assigns a second binary value, which corresponds to the inverted first binary value, to the second control signal, by means of which second binary value the sum of the path metric $(\gamma_t^{(1)})$ of the third state and the first branch metric $(\lambda_t^{(0)})$ is emitted from the second selection device as the path metric $(\gamma_{t+1}^{(1)})$ if the path metric difference ($\Gamma$) and the branch metric difference ($\Lambda$) each have a negative mathematical sign.

6. The ACS unit as claimed in claim 1, wherein the evaluation device is designed such that it assigns the binary value of the comparison result to the first control signal, if the path metric difference ($\Gamma$) and the branch metric difference ($\Lambda$) each have a positive mathematical sign, while the evaluation device assigns the inverted binary value of the comparison result to the first control signal if the path metric difference ($\Gamma$) and the branch metric difference ($\Lambda$) each have a negative mathematical sign.

7. The ACS unit as claimed in claim 1, wherein the evaluation device is designed as such that it assigns the binary value of the comparison results of the second control signal if the path metric difference ($\Gamma$) has a positive mathematical sign and the branch metric difference ($\Lambda$) has a negative mathematical sign, while the evaluation device assigns the inverted binary value of the comparison results of the second control signal if the path metric difference ($\Gamma$) has a negative mathematical sign and the branch metric difference ($\Lambda$) has a positive mathematical sign.

8. The ACS unit as claimed in claim 1, wherein the evaluation device has:
- a multiplexer which receives as input signal the branch metric difference ($\Lambda+$) and the negated value of the branch metric difference ($\Lambda-$), and is driven by a bit (sg($\Gamma$)) which indicates the mathematical sign of the path metric difference ($\Gamma$) formed by the differentiation device,
- a comparator which receives the path metric difference ($\Gamma$) and the output signal from the multiplexer, and
- an evaluation logic device which, as input signals, receives the output signal from the comparator, a bit (sg($\Lambda$)) which indicates the mathematical sign of the branch metric difference, and the bit (sg($\Gamma$)) which indicates the mathematical sign of the path metric difference, and emits the first and second control signals as a function thereof.

9. The ACS unit as claimed in claim 8, wherein the evaluation device has an input comparator, which carries out an initial comparison of the specific bits of the path metric difference ($\Gamma$) and of the branch metric difference ($\Lambda$) and supplies a corresponding comparison result to the evaluation logic device as a further input signal, and wherein the evaluation logic device takes account of the comparison results supplied from the input comparator when producing the first and second control signals.

10. The ACS unit as claimed in claim 9, wherein the input comparator carries out an initial comparison of the most significant bits of the path metric difference ($\Gamma$) and of the branch metric difference ($\Lambda$).

* * * * *